United States Patent
Loh et al.

(10) Patent No.: US 7,777,247 B2
(45) Date of Patent: Aug. 17, 2010

(54) SEMICONDUCTOR LIGHT EMITTING DEVICE MOUNTING SUBSTRATES INCLUDING A CONDUCTIVE LEAD EXTENDING THEREIN

(75) Inventors: Ban P. Loh, Durham, NC (US); Gerald H. Negley, Carrboro, NC (US); Yankun Fu, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 575 days.

(21) Appl. No.: 11/035,716

(22) Filed: Jan. 14, 2005

(65) Prior Publication Data

US 2006/0157726 A1    Jul. 20, 2006

(51) Int. Cl.
*H01L 29/24*    (2006.01)
*H01L 23/34*    (2006.01)

(52) U.S. Cl. .......................... 257/100; 257/98; 257/676; 257/680; 257/706; 257/675; 257/E33.072; 257/E33.073; 257/E33.075

(58) Field of Classification Search ........... 257/98–100, 257/676, 680, 706, 675, E33.072, E33.073, 257/E33.075
See application file for complete search history.

(56) References Cited

U.S. PATENT DOCUMENTS

| | | | |
|---|---|---|---|
| 5,785,418 A | 7/1998 | Hochstein |
| 5,789,772 A | 8/1998 | Jiang |
| 5,841,177 A | 11/1998 | Komoto et al. |
| 5,869,883 A | 2/1999 | Mehringer et al. |
| 5,959,316 A | 9/1999 | Lowery |
| 5,998,925 A | 12/1999 | Shimizu et al. |
| 6,238,599 B1 | 5/2001 | Gelorme et al. |
| 6,274,924 B1 | 8/2001 | Carey et al. |
| 6,307,272 B1 | 10/2001 | Takahashi et al. |
| 6,329,706 B1 | 12/2001 | Nam |
| 6,335,548 B1 | 1/2002 | Roberts et al. |
| RE37,707 E | 5/2002 | Bozzini et al. |
| 6,429,513 B1 | 8/2002 | Shermer, IV et al. |
| 6,444,498 B1 | 9/2002 | Huang et al. |
| 6,456,766 B1 | 9/2002 | Shaw et al. |

(Continued)

FOREIGN PATENT DOCUMENTS

DE    101 22 002 A1    11/2002

(Continued)

OTHER PUBLICATIONS

International Search Report for PCT/US2006/000335; Date of mailing Jul. 17, 2006.

*Primary Examiner*—Kenneth A Parker
*Assistant Examiner*—Joseph Nguyen
(74) *Attorney, Agent, or Firm*—Myers Bigel Sibley & Sajovec, PA

(57) ABSTRACT

A mounting substrate for a semiconductor light emitting device includes a thermally conductive mounting block. The mounting block has, in a first face thereof, a cavity that is configured to mount a semiconductor light emitting device therein and to reflect light that is emitted by the semiconductor light emitting device that is mounted therein away from the cavity. A conductive lead inserted into the mounting block extends into the cavity. The conductive lead is electrically isolated from the mounting block and has an exposed contact portion in the cavity. The conductive lead may be a plurality of conductive leads each having an exposed contact portion at different locations in the cavity. Related packaging methods also may be provided.

39 Claims, 10 Drawing Sheets

U.S. PATENT DOCUMENTS

| | | | |
|---|---|---|---|
| 6,457,645 B1 | 10/2002 | Gardner, Jr. | |
| 6,468,821 B2 | 10/2002 | Maeda et al. | |
| D465,207 S | 11/2002 | Williams et al. | |
| 6,492,725 B1 | 12/2002 | Loh et al. | |
| 6,674,096 B2 | 1/2004 | Sommers | |
| 6,984,852 B2* | 1/2006 | Wang et al. | 257/99 |
| 2002/0113244 A1 | 8/2002 | Barnett et al. | |
| 2002/0158320 A1 | 10/2002 | Takekuma | |
| 2003/0168670 A1 | 9/2003 | Roberts et al. | |
| 2003/0168720 A1 | 9/2003 | Kamada | |
| 2003/0201451 A1 | 10/2003 | Suehiro | |
| 2004/0041222 A1 | 3/2004 | Loh | |
| 2004/0070338 A1* | 4/2004 | Noguchi et al. | 313/512 |
| 2004/0075100 A1* | 4/2004 | Bogner et al. | 257/99 |
| 2004/0079957 A1 | 4/2004 | Andrews et al. | |
| 2004/0124487 A1 | 7/2004 | Loh | |
| 2004/0126913 A1 | 7/2004 | Loh | |
| 2005/0139846 A1* | 6/2005 | Park et al. | 257/98 |
| 2007/0063321 A1* | 3/2007 | Han et al. | 257/675 |

FOREIGN PATENT DOCUMENTS

| | | |
|---|---|---|
| EP | 1 385 217 A2 | 1/2004 |
| EP | 1 385 217 A3 | 1/2004 |
| JP | 2003298117 | 10/2003 |
| WO | 2004/053933 | 6/2004 |

* cited by examiner

SEMICONDUCTOR LIGHT EMITTING DEVICE MOUNTING SUBSTRATES INCLUDING A CONDUCTIVE LEAD EXTENDING THEREIN

FIELD OF THE INVENTION

This invention relates to semiconductor light emitting devices and manufacturing methods therefor, and more particularly to packaging and packaging methods for semiconductor light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions.

For example, it is known to provide a two-piece package for a semiconductor light emitting device, wherein the semiconductor light emitting device is mounted on a substrate that comprises alumina, aluminum nitride and/or other materials, which include electrical traces thereon, to provide external connections for the semiconductor light emitting device. A second substrate, which may comprise silver plated copper, is mounted on the first substrate, for example, using glue, surrounding the semiconductor light emitting device. A lens may be placed on the second substrate over the semiconductor light emitting device. Light emitting diodes with two-piece packages as described above are described in Application Serial No. US 2004/0041222 A1 to Loh, entitled Power Surface Mount Light Emitting Die Package, published Mar. 4, 2004, assigned to the assignee of the present invention, the disclosure of which is hereby incorporated herein by reference in its entirety as if set forth fully herein.

With multipart mounting packages for semiconductor light emitting devices, the different parts are typically made of different materials. As a result, the thermal impedance for such packages may be higher and a thermal mismatch may result among the various components within a package that may cause reliability problems with a package. For example, problems may result at an interface between a copper metal of a heat sink or cavity with a plastic of a body in which such a heat sink or cavity is mounted. In addition, assembly may be more complicated because of increased piece part counts for the package. In addition, where a sheet metal optical cavity is utilized, a cavity typically can only be fabricated in a limited range of depth and shape configurations. A larger optical cavity space may also result in such multipart packages, resulting in greater volumes of encapsulant in use, which may increase problems related to delamination and formation of bubbles within the encapsulant during temperature cycles.

For known power light emitting device packages, a relatively small heat-slug is typically utilized, which may be portion of the associated electrical leads or an isolated piece. A molded plastic body typically occupies a major part of the package and wraps around the heat spreading component. A lens may be mounted on top of the plastic body and surrounding an optical cavity and an encapsulant material may be used to fill the cavity, which may be hard epoxy or may be soft gel. An example of a prior art power light emitting device package is available from Lumileds Lighting, LLC of San Jose, Calif. as described in U.S. Pat. No. 6,274,924. As described in the '924 patent, a molded plastic body, which occupies a major bulk of the package, wraps around a piece of relatively small, isolated heat-slug on which an LED chip or chips may be mounted. A plastic lens may be locked onto the plastic body to form a closed space in the heat-slug and a portion of the plastic body. The enclosed space may be filled with a soft gel that may move in and out of the enclosed space through vents with temperature change. Such a product may not be surface mount technology (SMT) compatible as its packaging materials generally cannot withstand solder reflow temperatures. In addition, during use, the soft encapsulant may tend to form bubbles or delaminate from the enclosure walls, which may adversely affect device reliability.

SUMMARY OF THE INVENTION

Some embodiments of the present invention provide mounting substrates for a semiconductor light emitting device including a thermally conductive mounting block. The mounting block has, in a first face thereof, a cavity that is configured to mount a semiconductor light emitting device therein and to reflect light that is emitted by the semiconductor light emitting device that is mounted therein away from the cavity. A conductive lead inserted into the mounting block extends into the cavity. The conductive lead is electrically isolated from the mounting block and has an exposed contact portion in the cavity. The conductive lead may be a plurality of conductive leads each having an exposed contact portion at different locations in the cavity.

In further embodiments of the present invention, cutouts are provided in a sidewall of the cavity proximate respective ones of the contact portions that provide access to the contact portions from the cavity. The sidewall of the cavity may be a sloped sidewall and a reflective coating may be provided in the cavity. The mounting block may be a solid metal block. The metal block may be a solid steel block, a solid aluminum block or a solid copper block.

In other embodiments of the present invention, the mounting substrate is provided in combination with a semiconductor light emitting device that is mounted in the cavity. The semiconductor light emitting device may be a plurality of semiconductor light emitting devices. The semiconductor light emitting device(s) may be semiconductor light emitting diode(s). A lens may extend across the cavity and an encapsulant may be provided in the cavity that optically couples the semiconductor light emitting device(s) to the lens. The lens may be flexibly fitted to the mounting block to flex with expansion and contraction of the encapsulant. The lens may be latched and/or adhesively attached to the mounting block.

In further embodiments of the present invention, a phosphor is included. The phosphor may be a coating on the lens. The lens may include the phosphor dispersed therein. The phosphor may also be provided on the semiconductor light emitting device. In addition, an optical coupling media may be provided in the cavity at least partially surrounding the semiconductor light emitting device. A wire may be included electrically connecting the semiconductor light emitting device to the contact portion. The wire may connect an anode of the semiconductor light emitting device to the contact portion and a second conductive lead extending through the mounting block into the cavity that is electrically isolated from the mounting block and having an exposed contact portion in the cavity may be electrically connected at the contact portion to a cathode of the semiconductor light emitting device by a second wire.

In other embodiments of the present invention, the conductive lead is a molded lead having a non-conductive mold portion that electrically isolates the conductive lead from the mounting block and an electrical connector lead. The mounting block may include a passageway or channel extending inwardly to the cavity from a side face of the mounting block and the molded lead may be positioned in the passageway or channel. The mold portion may also include a key portion that mates with a socket in the mounting block to position the molded lead in the mounting block. The mold portion may also include an access passage or a plurality of access passages at displaced locations extending from the electrical connector lead to one of the first face or the second face that allows access for a tool to the lead during molding of the mold portion.

In further embodiments of the present invention, the plurality of conductive leads are a molded lead frame having a non-conductive mold portion that electrically isolates the conductive leads from the mounting block. The mounting block may include passageways or channels extending inwardly to the cavity from a side face of the mounting block and the molded lead frame may be positioned in the passageways or channels with each of the conductive leads extending through a respective one of the passageways or channels.

In yet other embodiments of the present invention, the conductive lead includes a surface mount technology (SMT) lead on an end thereof extending from the mounting block. The SMT lead may be a J-bend or a gullwing lead. The mounting block may include a cutaway portion in the second face configured to receive the J-bend lead.

In yet further embodiments of the present invention, mounting substrates for a semiconductor light emitting device include a thermally conductive mounting block having a first and second opposing face, the first face including thereon a mounting surface that is configured to receive a semiconductor light emitting device thereon. A conductive lead extends inwardly from a side face of the mounting block through the mounting block, the conductive lead being electrically isolated from the mounting block and having an exposed contact pad on a surface thereof facing the first face of the mounting block. A passageway is provided in the first face of the mounting block and extending towards the exposed contact pad to allow passage of an electrical connection from the first face of the mounting block to the exposed contact pad.

In other embodiments of the present invention, a reflector is provided on the first face of the mounting block that defines a cavity around the semiconductor light emitting device that is configured to reflect light that is emitted by the semiconductor light emitting device way from the cavity. The passageway in the first face may be in communication with the cavity. The conductive lead may be a plurality of conductive leads each having a contact pad and the passageway may then be a plurality of passageways extending to respective ones of the contact pads. The mounting block may include passageways or channels extending inwardly to the passageway(s) in the first face from a side face of the mounting block and a molded lead frame may be positioned in the passageways or channels from the side face with each of the conductive leads extending through a respective one of the passageways or channels from the side face.

In further embodiments of the present invention, semiconductor light emitting device packaging methods include fabricating a solid metal mounting block including first and second opposing metal faces. The first metal face includes therein a cavity configured to mount a semiconductor light emitting device therein and to reflect light that is emitted by the semiconductor light emitting device that is mounted therein away from the cavity. A molded lead having a non-conductive molded body portion and a conductive lead extending therethrough is fabricated. The molded lead is inserted in the mounting block and extending into the cavity. The molded lead is isolated from the mounting block by the non-conductive body portion and has an exposed contact portion in the cavity. The semiconductor light emitting device is mounted in the cavity and electrically connected to the exposed contact portion.

In other embodiments of the present invention, a lens is placed across the cavity with the semiconductor light emitting device therein. The lens may be coated with phosphor. An optical coupling media may be placed in the cavity at least partially surrounding the semiconductor light emitting device.

DETAILED DESCRIPTION

Figure 1:
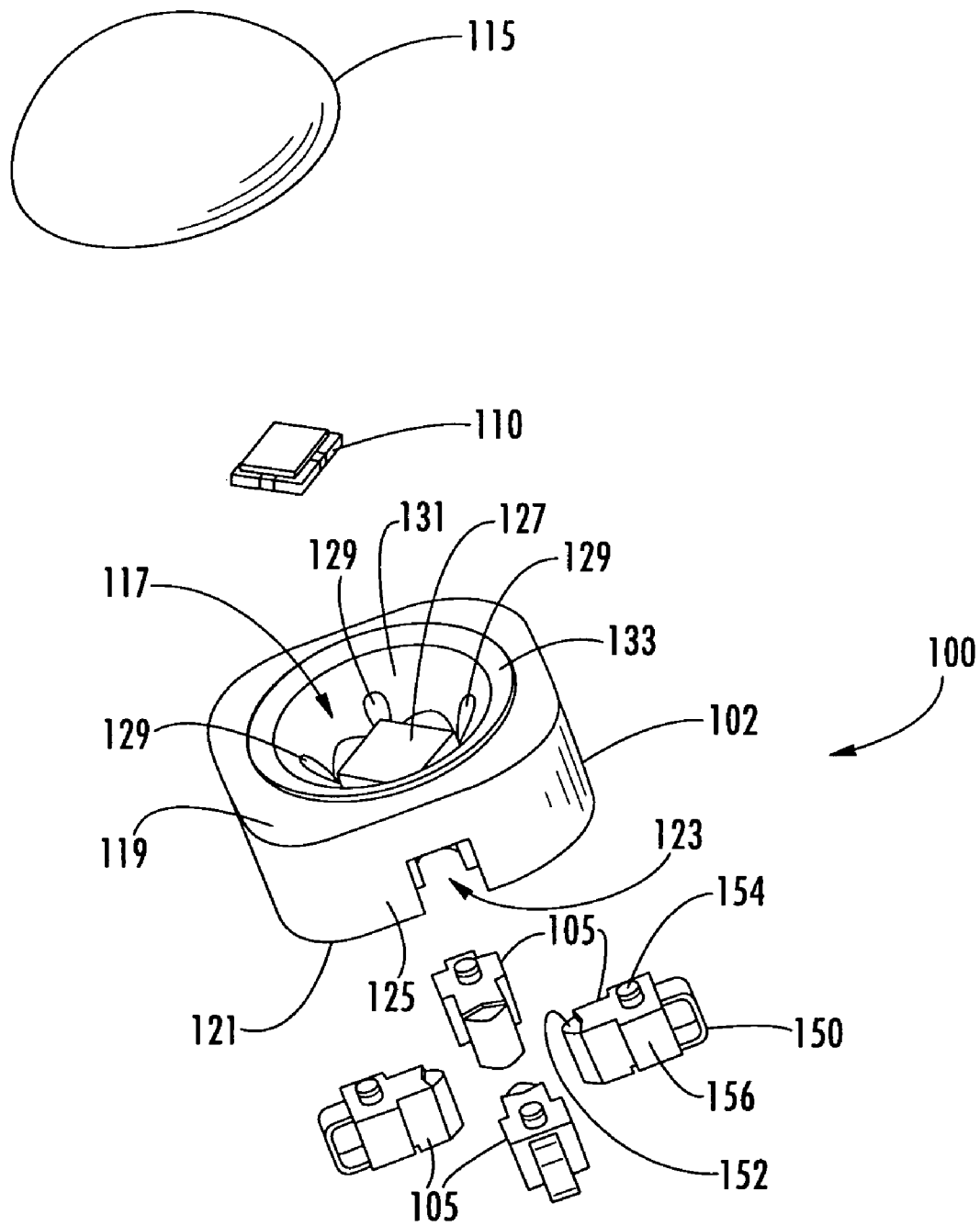
FIG. 1 is an exploded perspective view of a semiconductor light emitting device package according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to drawings that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of packaged semiconductor light emitting devices and mounting substrates for the same will now be further described with reference to FIG. 1-9. FIG. 1 is an exploded perspective view of a semiconductor light emitting device package 100 according to some embodiments of the present invention. The semiconductor light emitting device package 100 includes a thermally conductive mounting block 102 which, in combination with conductive leads 105, provides a mounting substrate for one or more semiconductor light emitting devices, such as the light emitting diode (LED) devices 110. The illustrated embodiments of a semiconductor light emitting device package 100 further include a lens 115.

The semiconductor light emitting device(s) 110 can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide, gallium nitride or other microelectronic substrates, and one or more contact layers which may comprise metal and/or other conductive layers. The design and fabrication of semiconductor light emitting devices are well known to those having skill in the art.

For example, the light emitting device(s) 110 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is incorporated by reference herein as if set forth fully, may also be suitable for use in embodiments of the present invention.

The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

The mounting block 102 has a first face 119 and an opposite second face 121. The first face 119 includes a cavity 117 that is configured to mount the LED devices 110 therein and to reflect light that is emitted by the LED devices 110 away from the cavity 117 through the lens 115.

The conductive leads 105 inserted in the mounting block 102 extend into the cavity 117. The conductive leads are electrically isolated from the mounting block 102 and include an exposed contact portion 152 that is positioned in the cavity 117. The conductive leads 105 illustrated in FIG. 1 are molded leads having a non-conductive mold portion 156 that electrically isolates a electrical connector lead 150 from the mounting block 102. Also shown in the embodiments of FIG. 1 is a key portion 154 on the mold portion 156 that mates with a socket 221 (FIG. 2B) in the mounting Block 102 to position the illustrated molded lead 105 in the mounting block 102.

The mounting block 102 includes a channel 123 for each of the molded leads 105 extending inwardly to the cavity 117 from a side face 125 of the mounting block 102. The molded leads 105 are positioned in respective channels extending from each of four locations on the side face 125 for the illustrated embodiments of FIG. 1.

A mounting surface 127 configured to receive the LED devices 110 is provided in the cavity 117 of the mounting block 102. The cavity 117 and mounting surface 127 may be, for example, an anodized aluminum coated with a reflective material. For the illustrated embodiments of FIG. 1, the cavity 117 includes a sloped sidewall 131 extending downwardly from the first face 119 towards the mounting surface 127. In addition, cutouts 129 are provided in the sidewall 131 of the cavity 117 proximate respective ones of the contact portions 152 that provide access to the contact portions 152 from the cavity 117. The described details of the features positioned in the cavity 117 of the mounting block 102 are further illustrated in the perspective view of FIG. 2A.

Figure 2B:
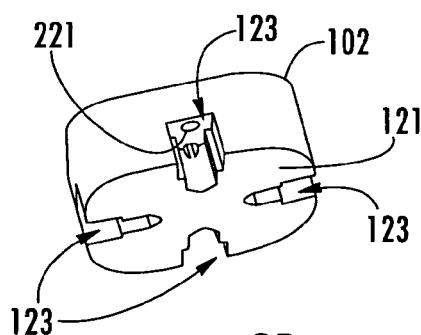
FIG. 2B is bottom perspective view of the mounting block of FIG. 2A.

Additional details of the channel 123 are seen in the bottom perspective view of FIG. 2B illustrating the four respective channels 123 configured to receive molded leads 105 therein. As discussed previously, the socket 221 of one of the channels 123 is also illustrated in FIG. 2B. It will be understood that, while four channels 123 receiving four molded leads 105 are illustrated in the figures, a single lead or other combinations thereof and a corresponding single channel 123 or other combinations thereof arranged in the mounting block 102 also fall within the scope of the present invention.

Figure 3A:
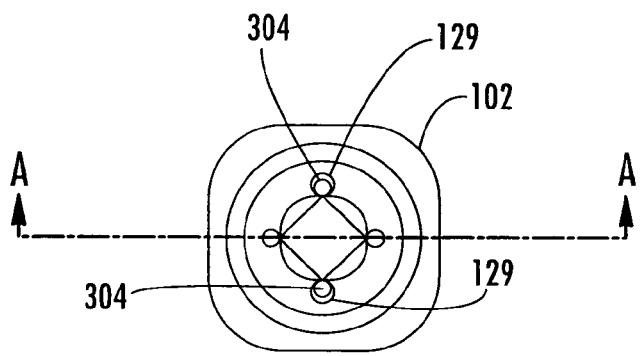
FIG. 3A is a top plane view of the mounting block of FIG. 2A.
Figure 2A:
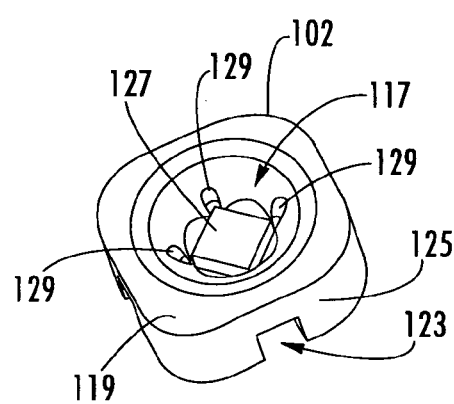
FIG. 2A is a top perspective view of a mounting block according to some embodiments of the present invention.
Figure 3B:
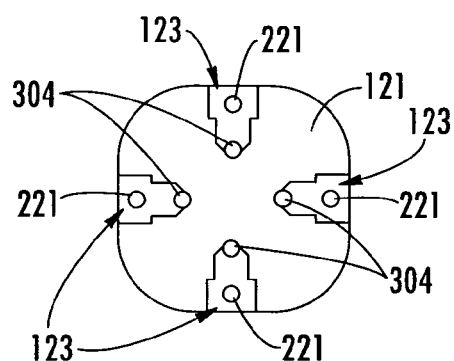
FIG. 3B is a bottom plane view of the mounting block of FIG. 2A.
Figure 4:
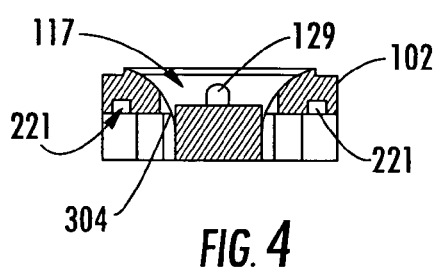
FIG. 4 is a cross sectional view of the mounting block of FIG. 2A taken along the line AA of FIG. 3A.

Further details of the mounting block 102 will now be described with reference to the top view of FIG. 3A, bottom view of FIG. 3B and the cross sectional view of FIG. 4, which is taken along line AA of FIG. 3A. As seen in FIG. 3A and FIG. 4, the mounting Block 102 includes an opening 304 extending from the cavity 117 to each of the respective channels 123 that allows access to the respective contact portions 152 from the cavity 117. The openings 304 are accessible through the cutouts 129. The socket 221 and opening 304 for each of the channels 123 are further shown in respective locations in the bottom view of FIG. 3B.

While channels 123 have been described with reference to the embodiments illustrated in FIG. 1 through FIG. 4, it will be understood that the channel 123, in some embodiments of the present invention, is an access passageway that is not exposed from the bottom face 121 of the mounting block 102 as illustrated by the dashed line item 1324 in FIGS. 13A and 13B. However, a channel 123 is shown in the figures to allow more ready illustration of the particular features contained within the channel and/or passageway 123. Thus, as with the plurality of channels 123, a plurality of passageways at displaced locations around the mounting block 102 may utilized to receive a plurality of conductive leads 105 in various embodiments of the present invention.

Figure 5:
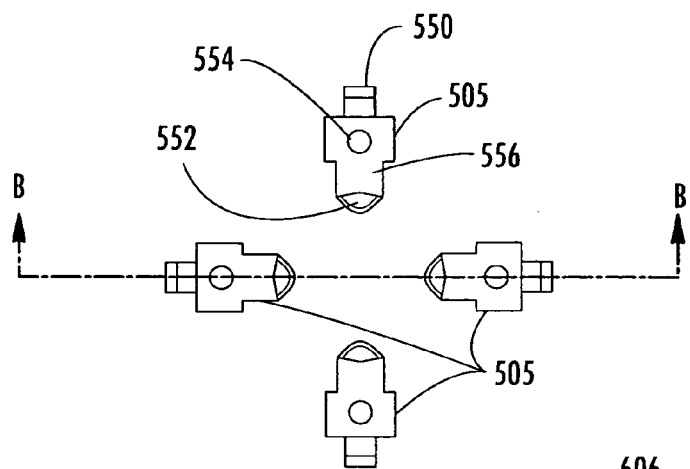
FIG. 5 is a top plane view of molded conductive leads according to some embodiments of the present invention.
Figure 6:
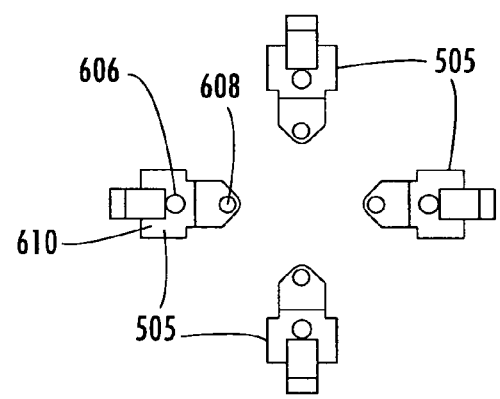
FIG. 6 is a bottom plane view of the molded conductive leads of FIG. 5.
Figure 7:
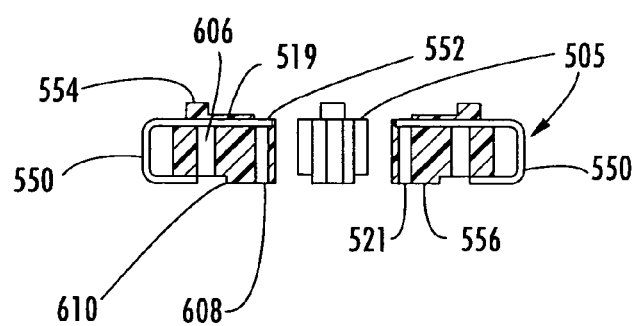
FIG. 7 is a cross sectional view of the molded conductive leads of FIG. 5 taken along line BB.

Further embodiments of the present invention will now be described with reference to FIGS. 5 through 7. FIG. 5 is a top plane view of a plurality of molded leads 505 according to some embodiments of the present invention. FIG. 6 is a bottom view of the molded leads 505 of FIG. 5. FIG. 7 is a cross sectional view taken along line BB of FIG. 5. Molded leads 505 include a key 554 in a first face 519 of the molded lead 505 that may be utilized to position and retain the molded lead 505 in a channel or passageway 123 of a mounting block 102.

Figure 11:
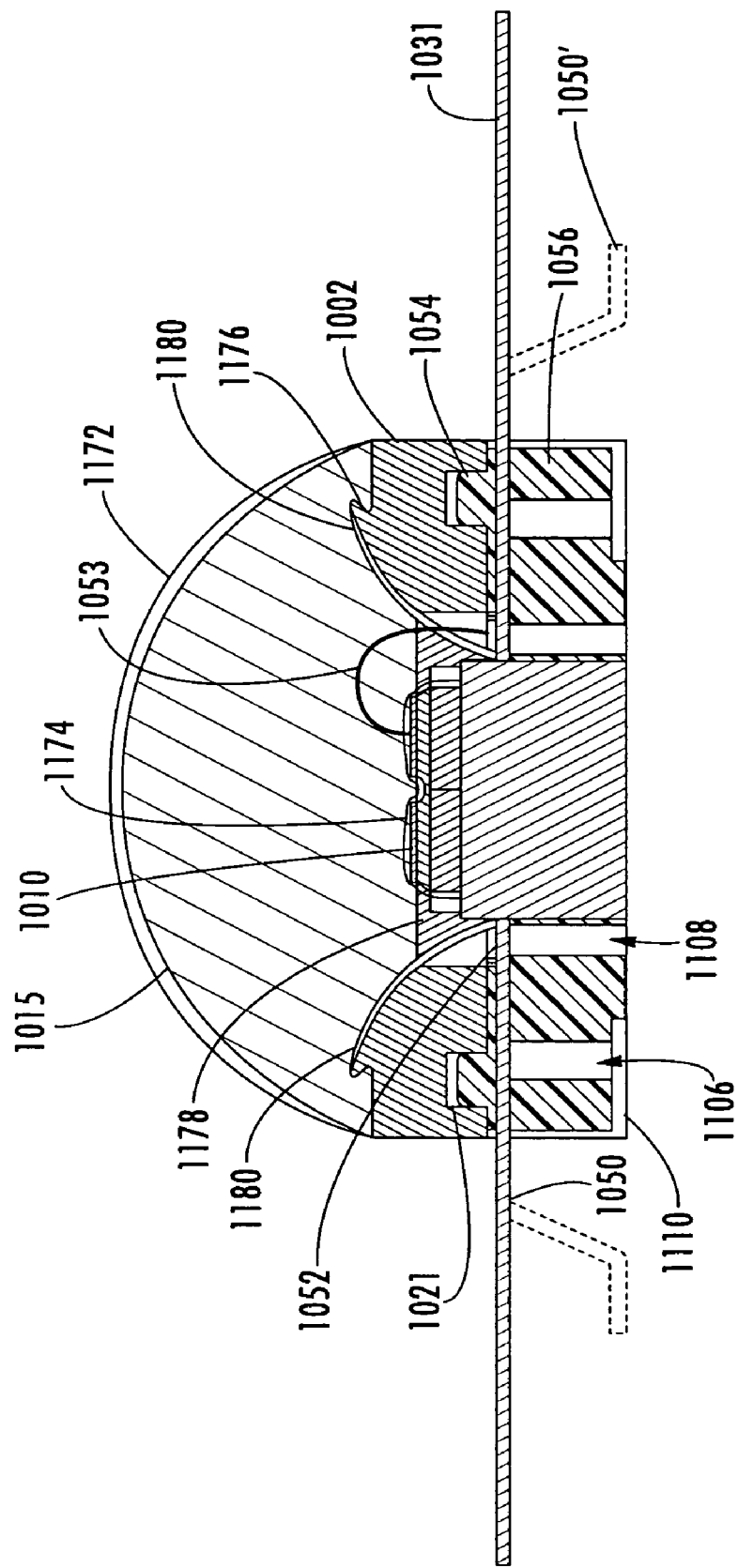
FIG. 11 is a cross sectional view of the package of FIG. 10 taken along line CC.

The conductive electrical connector leads 550, as shown in the embodiments of FIGS. 5 through 7, are surface mount technology (SMT) leads, in particular, J-bend leads. However, it will be understood that other types of lead configurations may be utilized, such as a gull-wing lead 1050' (FIG. 11).

Additional details of the molded leads 505 are further illustrated in FIG. 7. As seen in FIG. 7, a second face 521 of a molded body portion 556 of the molded lead 505 includes a cutaway portion 610 configured to receive the J-bend lead 550 on a face opposite the key 554. In addition, a plurality of access passages 606, 608 are shown in FIG. 7 at displaced locations through the mold portion 556. The access passages 606, 608 extend from the lead 550 to the second face 521 of the mold portion 556 to allow access for a tool to the lead 550 during molding of the mold portion 556.

Figure 8:
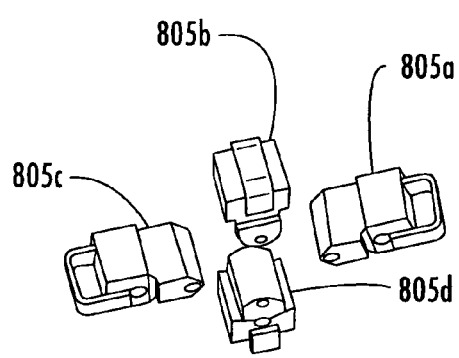
FIG. 8 is a perspective view of molded conductive leads according to further embodiments of the present invention.

FIG. 8 illustrates additional embodiments of an arrangement including a plurality of conductive leads 805a, 805b, 805c, 805d. The embodiments illustrated in FIG. 8 differ from those described above with reference to FIGS. 5 through 7 in the asymmetrical arrangement of the respective conductive leads 805a, 805b, 805c, 805d. It will be understood that a corresponding arrangements of channel or passageways 123 in the mounting substrate 102 may be utilized to accommodate the arrangement illustrated in FIG. 8.

It is often desirable to incorporate a phosphor into the light emitting device, to enhance the emitted radiation in a particular frequency band and/or to convert at least some of the radiation to another frequency band. Phosphors may be included in a light emitting device using many conventional techniques. In one technique, phosphor is coated inside and/or outside a plastic shell of the device. In other techniques, phosphor is coated on the semiconductor light emitting device itself, for example using electrophoretic deposition. In still other embodiments, a drop of a material such as epoxy that contains phosphor therein may be placed inside the plastic shell, on the semiconductor light emitting device and/or between the device and the shell. LEDs that employ phosphor coatings are described, for example, in U.S. Pat. Nos. 6,252,254; 6,069,440; 5,858,278; 5,813,753; 5,277,840; and 5,959,316.

Figure 9:
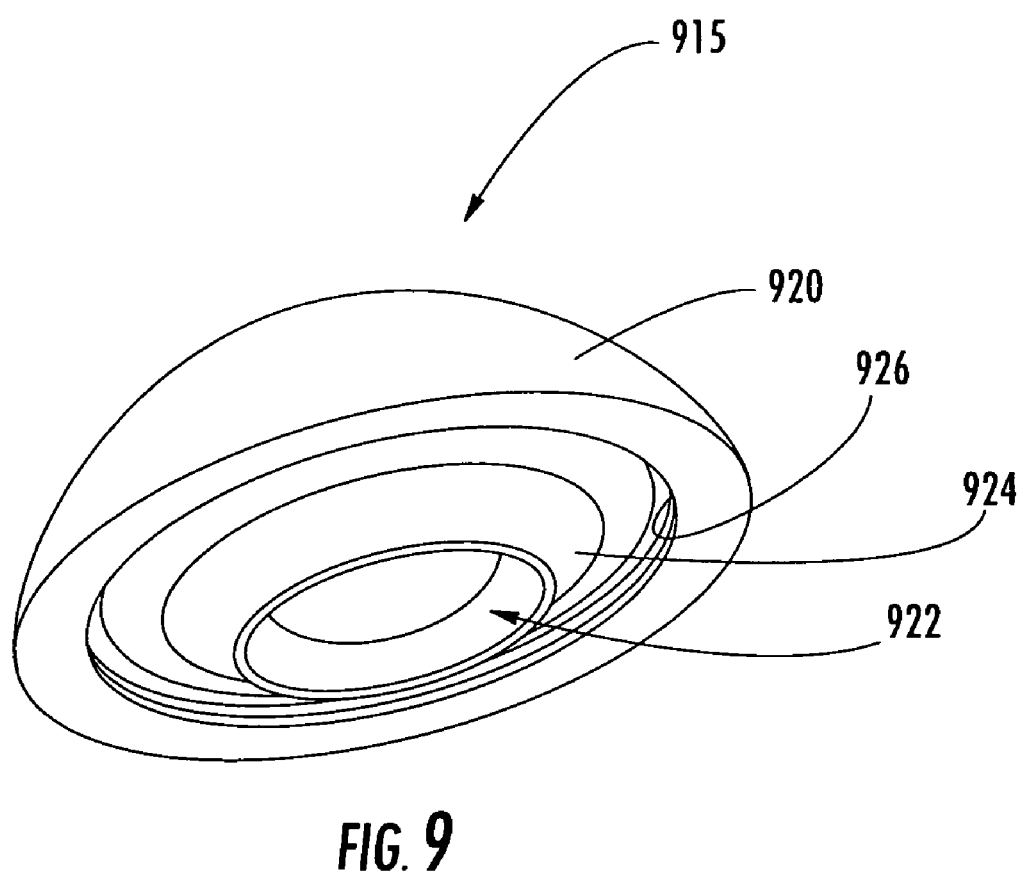
FIG. 9 is a bottom perspective view of a lens according to some embodiments of the present invention.

Embodiments of a lens 915 suitable for use in semiconductor light emitting device package 100 according to some embodiments of the present invention are illustrated in the bottom perspective view of FIG. 9. As shown in FIG. 9, the lens 915 may include a coating 920, such as phosphor, on the lens 915. Also shown in the illustrated embodiments of FIG. 9 is a cavity 922 configured to receive the LED devices 110 when the lens 915 is positioned on the mounting block 102. An alignment slope portion 924 extends upwardly from the opening into the cavity 922. Also shown is a latching channel 926 that may be used for mounting the lens 915 to the mounting block 102 as will be further described herein. It will be further understood that, while the phosphor was described as a coating 920 above, it may also be dispersed within the lens 915 in other embodiments of the present invention rather than being provided as a coating. The phosphor may also be an inside face coating rather than an outside face coating.

The a lens 915 may be a transparent plastic. As used herein, the term "transparent" means that optical radiation from the semiconductor light emitting device can pass through the material without being totally absorbed or totally reflected. As is well known to those having skill in the art, the lens 915 may comprise polycarbonate material and/or other conventional plastic materials that are used to fabricate transmissive optical elements. Moreover, the phosphor of the coating 920 can comprise any conventional phosphor including cerium-doped YAG and/or other conventional phosphors. In some specific embodiments, the phosphor comprises Cerium doped Yttrium Aluminum Garnet (YAG:Ce). In other embodiments, nano-phosphors may be used. Phosphors are well known to those having skill in the art and need not be described further herein.

The phosphor may be uniformly dispersed within the lens 915. In contrast, the phosphor may be nonuniformly dispersed in the lens 915. Various patterns of phosphor may be formed, for example, to provide areas of higher intensity and/or different color and/or to provide various indicia on the lens 915 when illuminated. In FIG. 9, the lens 915 is a dome-shaped lens. As used herein, the terms "dome" and "dome-shaped" refer to structures having a generally arcuate surface profile, including regular hemispherical structures as well as other generally arcuate structures that do not form a regular hemisphere, which are eccentric in shape and/or have other features, structures and/or surfaces.

Figure 10:
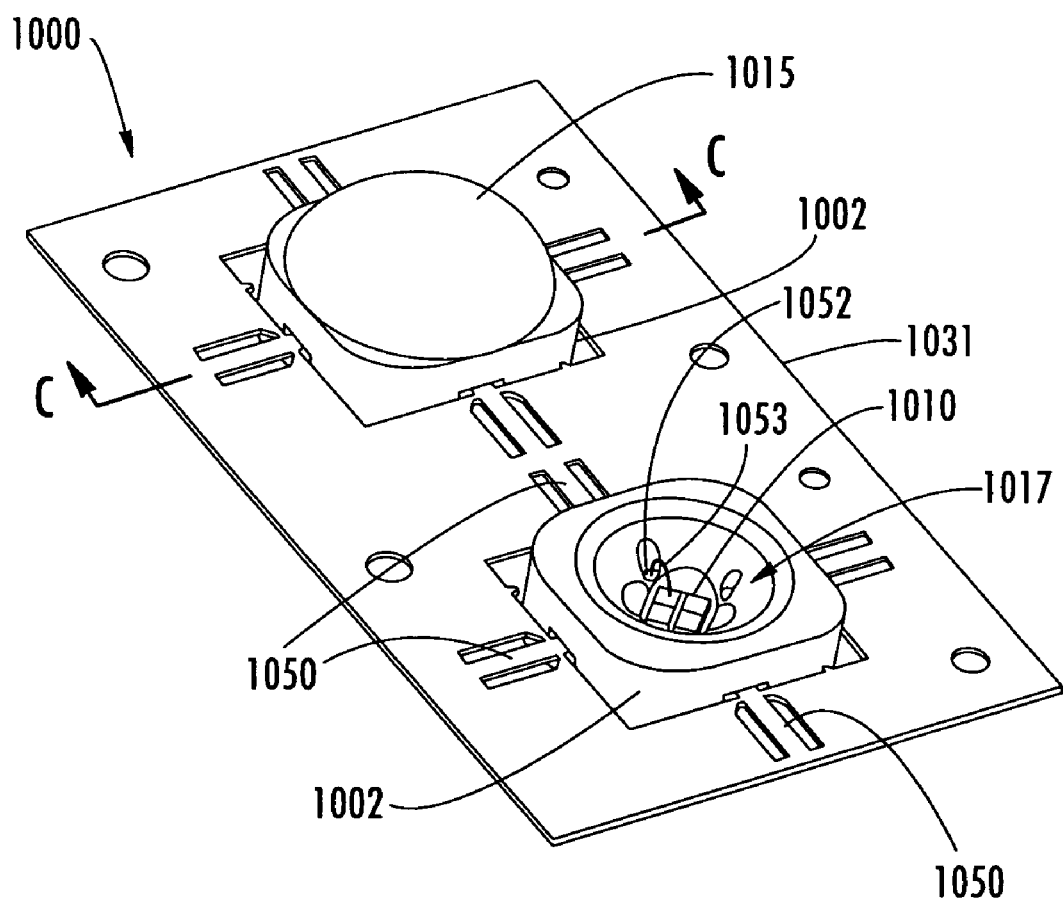
FIG. 10 is a top perspective view of a molded lead frame and semiconductor light emitting device package according to some embodiments of the present invention.
Figure 12:
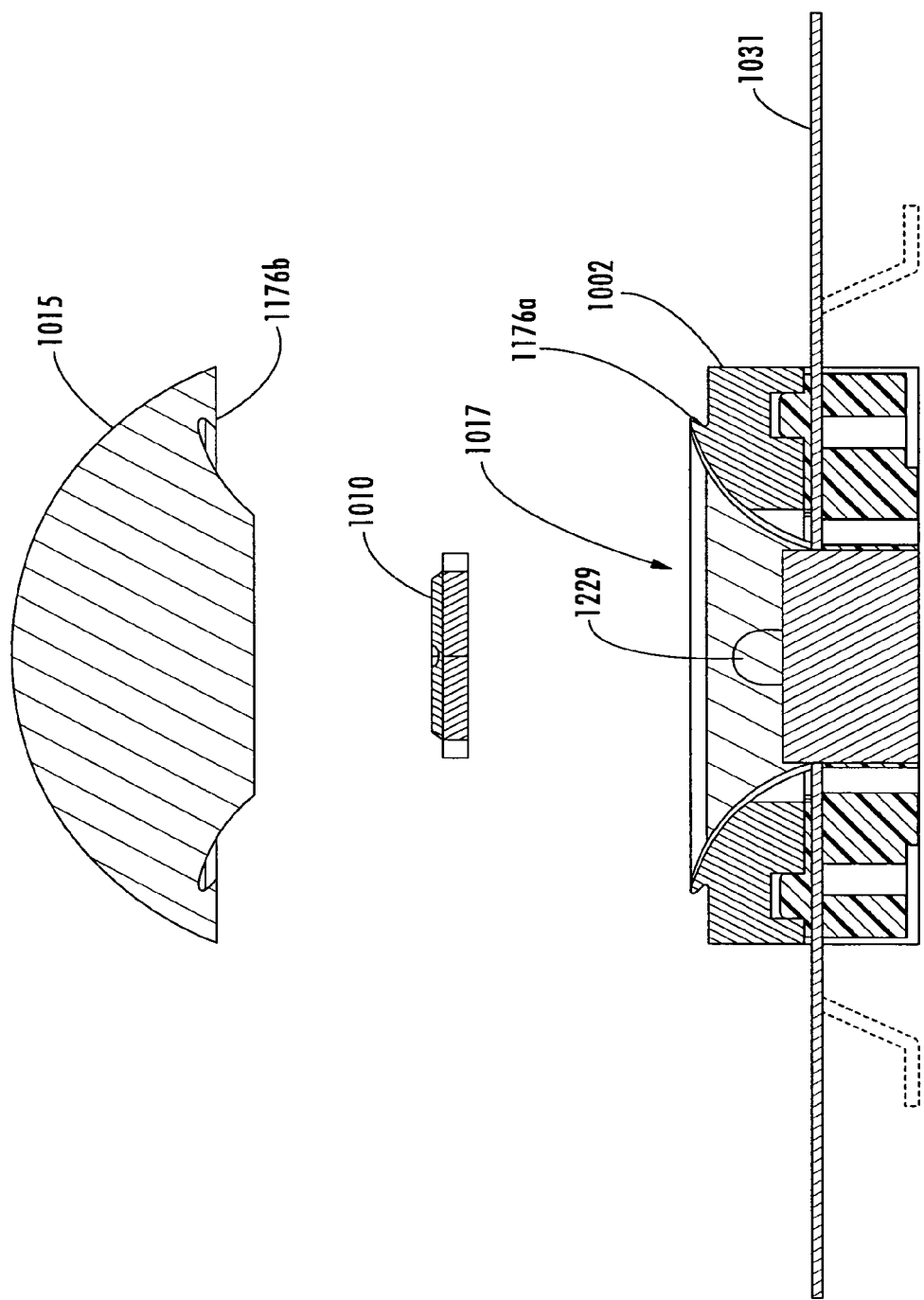
FIG. 12 is an exploded cross sectional view of the package of FIG. 11.

Further embodiments of mounting substrates for semiconductor light emitting devices and semiconductor light emitting device packages including the same will now be described with reference to FIGS. 10-12. FIG. 10 is perspective view illustrating a molded lead frame based semiconductor light emitting device package 1000. FIG. 11 is a cross sectional view illustrating the package 1000 taken along the line CC in FIG. 10. FIG. 12 is an exploded cross sectional view taken along the line CC in FIG. 10. Two mounting blocks 1002 are shown in a lead frame 1031 in the embodiments of FIG. 10. One of the mounting blocks 1002 is shown with a lens 1015 extending across a cavity 1017 in the mounting block 1002. The lens 1015 may be flexibly fitted to the mounting block 1002 to flex with expansion and contraction of encapsulant disposed in the cavity 1017 as will be further described herein.

The molded lead frame 1031 includes a plurality of conductive electrical connector leads 1050 extending through the respective mounting blocks 1002 to the cavities 1017 of the respective mounting blocks 1002 to provide for extension of an electrical connection from one or more semiconductor light emitting devices 1010 in the cavity 1017 to an external circuit or the like external to the mounting block 1002. The electrical connector leads 1050 include a contact portion (or pad) 1052 accessible from within the cavity 1017.

Also shown in the embodiments of FIG. 10 is a wire 1053 electrically connecting the semiconductor light emitting device 1010 to the contact portion 1053. It will be understood, that in practice, a plurality of wires 1053 may be utilized. For example, one of the wires may connect an anode of the semiconductor light emitting device 1010 to the contact portion 1052 of one electrical connector lead 1015 while a second wire electrically connects a cathode of the semiconductor light emitting device 1010 to the contact portion 1052 of another lead 1050. While not seen in FIG. 10, it will be understood from viewing FIG. 11 and FIG. 12, as will be further discussed, that the lead frame 1031 includes a non-conductive mold portion 1056 electrically isolating the electrical connector leads 1050 from the mounting blocks 1002.

Referring now to the embodiments illustrated in FIGS. 11 and 12, the molded lead frame 1031 includes the non-conductive mold portion 1056 positioned in channels through a thermally conductive mounting block 1002 to allow the electrical connector leads 1050 to extend through respective ones of the channels into the cavity 1017 without electrically contacting the mounting block 1002. When separated from the molded lead frame 1031, the electrical connector leads 1050 may be given a gull-wing configuration 1050' as illustrated in FIG. 11 or a J-bend configuration as described previously in embodiments where a surface mount technology (SMT) lead is desired.

Also shown in the non-conductive mold portion 1056 for the embodiments illustrated in FIGS. 11 and 12 are access passages 1106 and 1108 extending through the mold portion 1056 at displaced locations to allow access to the electrical connector lead 1050 by a tool during molding of the mold portion 1056. In addition, a key 1054 is shown for securing and positioning the mold portions 1056 in respective channels of the mounting block 1002 using respective sockets 1021 therein. A cutaway 1110 is also illustrated in a bottom face of the mold portion 1056 that may be used, for example, to receive an end of the lead 1050 in J-bend lead configurations of the present invention.

For the embodiments illustrated in FIG. 11, a reflective coating 1180 is included on the sloped sidewalls of the cavity 1017. In addition, an encapsulant 1178 is included in the cavity 1017 that optically couples the semiconductor light emitting device 1010 with the lens 1015. The lens 1015 is shown as latched to the mounting block 1002 for the embodiments of FIG. 11 at latching portion 1176. As seen in FIG. 12, the latching portion 1176 may include a latching arm 1176a formed in the mounting block 1002 and a corresponding receiving recess portion 1176b in the lens 1015. It will be understood that, in alternative embodiments of the present invention, the lens 1015 may be adhesively attached to the mounting block 1002. It will also be understood that the lens 1015 may be flexibly fitted to the mounting block 1002 by the configuration of the latching portion 1176 or the selected adhesive to allow it to flex with expansion and contraction of the encapsulant 1178. It will be further understood that, in some embodiments of the present invention, another optical coupling media than an encapsulant may be utilized at least partially surrounding the semiconductor light emitting device 1010.

The encapsulant 1178 may be an epoxy and/or other optical coupling media (e.g., silicon). The encapsulant 1178 can enhance optical coupling from the light emitting device 1010 to the lens 1015.

In some applications of semiconductor light emitting device packages, it is desired to incorporate a composition affecting the color and/or the like of emitted light from the semiconductor light emitting package, such as a phosphor. As shown in FIG. 11, in different embodiments of the present invention, a coating of phosphor 1172 may be disposed on the lens 1015 and/or, depending upon the form of the lens 1015, the phosphor 1172 may be dispersed within the lens 1015 rather than being formed as a coating. In yet further embodiments of the present invention, a coating of phosphor 1174 may be placed on the semiconductor light emitting device 1010 in addition to or rather than on the lens 1015. FIG. 12 illustrates a cutaway 1229 in the cavity 1017 of the mounting block 1002 that allows access to the content portion (pad) 1052.

As described above, various embodiments of the present invention may provide a semiconductor light emitting device package, such as a high-power photonic device including one or more LEDs or a laser package, built on a one-piece, solid, three-dimensional substrate of thermally conductive material. The substrate or mounting block may include an optically shaped cavity inside which the photonic chip or chips are mounted, which cavity may capture light received from or targeted on the photonic chip(s). The cavity may be filled with an encapsulant or other optical coupling media and may be covered by a lens selected for imaging performance purposes. In some embodiments of the present invention, the mounting block is a solid structural body that may be made of a thermally conductive material such as a metal block (for example, a solid steel block, a solid aluminum block or a solid copper block). The mounting block may also, in some instances, be an anodized aluminum or a ceramic material and may include an optical reflective cavity in which the photonic chips are mounted. An encapsulant may optically couple the photonic chip(s) to a lens and a set of electrodes (electrical connector leads) that are electrically isolated from the solid mounting block body may connect to the photonic chip(s) by bond wires at one end and be formed to, for example, a J-bend or gullwing shape at an opposite end for surface mount technology (SMT) connection to an external circuit for power supply or the like.

Thus, some embodiments of the present invention may provide a power device that is an SMT device and may provide improved thermal spreading capability and a relatively large thermal capacitance. A three-dimensional substrate of the mounting block may take on substantially any desired internal or external shape with geometry and features thereof selected to meet a variety of different applications, such as illumination, accent lighting and the like where a metal type mounting block is used, the metal manufacturability for metal working processes may be cost efficient in a volume production environment. In addition, a compact size package may be provided that may be well suited to clustering of packages to form intense lighting applications. The mounting block body may be utilized as a heat spreader to dissipate heat and further, while not shown in the illustrations herein, may also include a heat sink feature that can be made to include fins or the like for convection cooling as needed. In addition, an external heat sink or medium may be thermally attached to substantially any desired part of the mounting block body to further cool the semiconductor light emitting device package during use. For example, the mounting block body may be physically and thermally coupled to the base of an automotive headlamp housing, which may aid in dissipating heat from the package.

Where it is integrated in the mounting block structure, the optical cavity may take on a variety of optical designs to control a photonic radiation pattern emitted by or targeted on the light emitting device therein. It may also serve as a receiving well for containing an encapsulant utilized to optically couple the enclosed light emitting device(s) to the lens extending thereover. Furthermore, where a lens is used, in some embodiments of the present invention, the lens may be hard glass or soft plastic lens, such as silicon, that may flex to accommodate volume change of an encapsulant within the cavity.

Further embodiments of the present invention will now be described with reference to FIGS. 13A and 13B. FIGS. 13A and 13B are, respectively, top and bottom perspective views of a mounting block 1302 according to further embodiments of the present invention. The thermally conductive mounting block 1302 has a first face 1319 and a second, opposing face 1321. The first face 1319 includes thereon a mounting surface 1385 that is configured to receive a semiconductor light emitting device thereon. A plurality of channels 1323 or passageways 1324 are illustrated extending inwardly from a side face 1325 of the mounting block 1302 that are configured to receive conductive leads 105, 505 as described above or conductive leads 1405 as will be described with reference to FIGS. 14 and 14B.

Figures 13A, 13B:
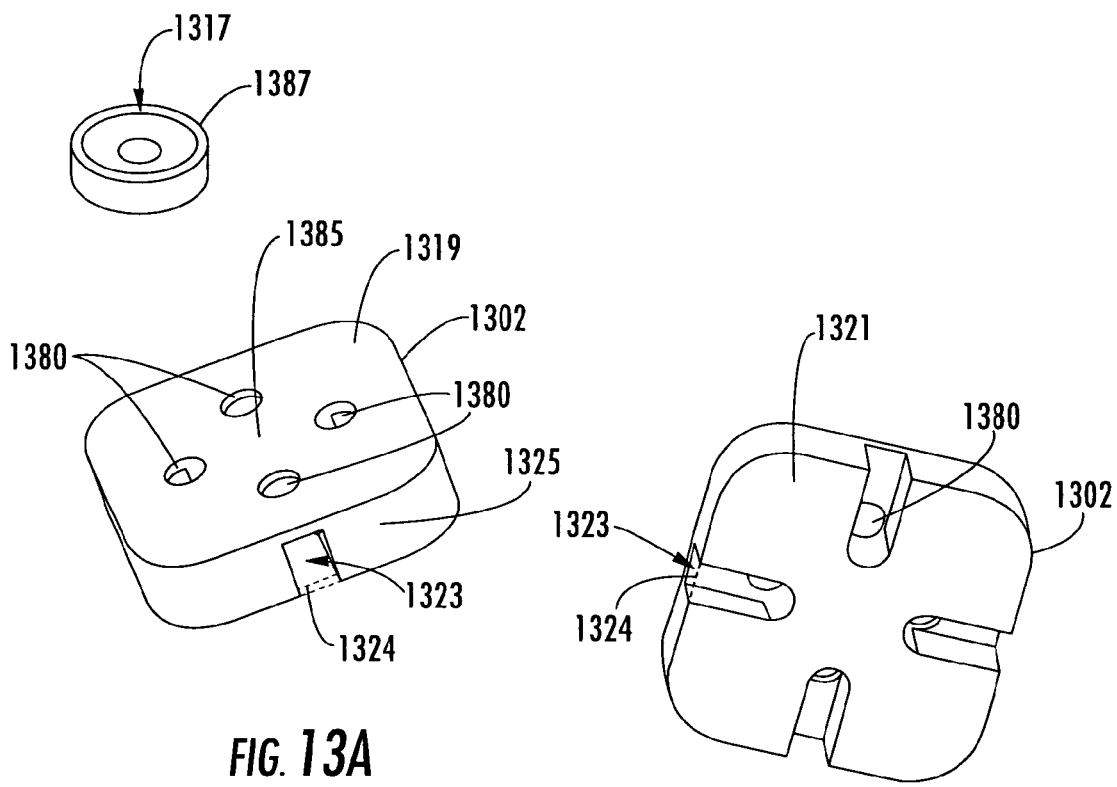
FIG. 13A is a top perspective view of a mounting block according to further embodiments of the present invention.
FIG. 13B is a bottom perspective view of the mounting block of FIG. 13A.

Also shown in FIGS. 13A and 13B are passageways 1380 in the first face 1319 of the mounting block 1302 that expose the channels 1323 or passageways 1324. It will be understood that the passageways 1380 thereby expose a contact pad 152, 552, 1452 of a conductive lead 105, 505, 1405 positioned in the channel 1323 or passageway 1324. The passageways 1380 are configured to allow passage of an electrical connection, such as a wire, extending from a semiconductor light emitting device positioned on the first face 1319 of the mounting block 1302 to an exposed contact pad portion 152, 552, 1452. It will be understood that, as with the previously described embodiments, while four separate channels 1323 or passageways 1324 are shown in FIGS. 13A and 13B, more or less channels 1323 or passageways 1324 and associated passageways 1380 may be provided in other embodiments of the present invention.

A reflector 1387 may also be provided on the first face 1319 of the mounting block to define a cavity 1317 that may be situated around a semiconductor light emitting device on the mounting surface 1385. The reflector 1387 may be configured to reflect light that is emitted by a semiconductor light emitting device away from the cavity 1317 and the passageways 1380 may be in communication with the cavity 1317.

Figure 14A:
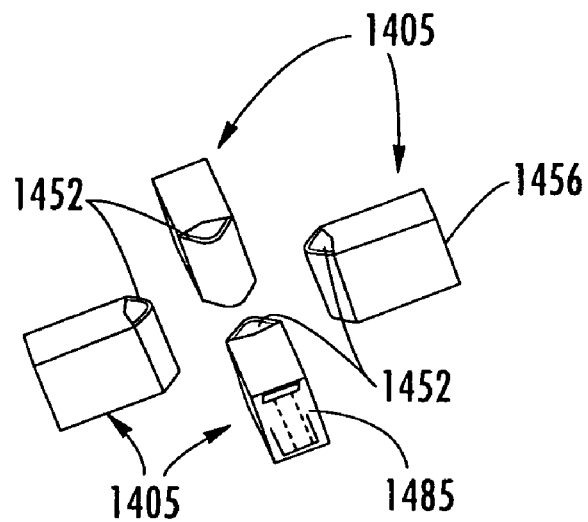
FIG. 14A is a top perspective view of molded conductive leads according to further embodiments of the present invention.
Figure 14B:
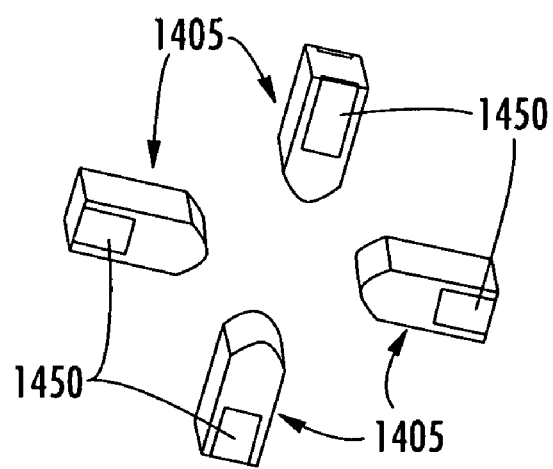
FIG. 14B is a bottom perspective view of the molded leads of FIG. 14A.

Referring now to FIGS. 14A and 14B, alternative embodiments of molded leads 1405 will now be described. The conductive leads 1405 include a mold portion 1456 and a contact (pad) portion 1452. In addition, a solder pad 1450 is provided on a face of the conductive leads 1405 opposite from the face including the contact (pad) portion 1452. A conductive electrical connector lead 1485 may be incorporated in the mold portion 1456 that electrically connects the contact (pad) portion 1452 and the solder pad 1450. It will be understood that the conductive leads 1405 may be positioned in respective channels 123, 1323 as described previously with reference to the conductive leads 105, 505.

In some embodiments of the present invention, a one-piece mounting block configuration may provide a compact package size and small footprint for a semiconductor light emitting device package as no joints or mating surfaces, such as used with various prior art packages, may be needed, as the one-piece design need not be made from different piece parts that may require such mating surfaces for assembling. In addition, a compact package with excellent thermal performance may offer various advantages over larger packages including a corresponding power light emitting device. Such advantages, in various embodiments of the present invention, may include providing more Lumens per square area footprint, which may create a more intense light source that may be needed for such applications as a headlamp of a vehicle, a spotlight, or the like. Such a compact package, in some embodiments of the present invention, may also allow several light emitting device packages to be clustered into a small space, which may produce a better mixture of their colors and provide for improved control of a radiation pattern therefrom. A compact package may also be lighter weight and have lower material, plating, storage and/or handling costs for both the respective piece parts and the finished light emitting device package. User benefits may also be realized from smaller space and system circuitry configurations.

In particular embodiments of the present invention, excellent thermal spreading and low thermal impendence may be provided within the mounting block of the semiconductor light emitting device package. A higher thermal impendence that may result from a multi-part structure may also result in a thermal mismatch among the various components within the semiconductor light emitting device package, which could cause reliability of problems for the semiconductor light emitting device package, for example, between the copper metal of a heat sink or cavity and plastic material of a body. A variety of radiation patterns may also be produced in some embodiments using different optical cavity designs that may readily introduced into a three-dimensional body structure of the mounting block defined substrate.

Where a lens is used in some embodiments of the present invention, it may be mechanically fitted or bonded in place and may be configured to allow fluxing as the encapsulant expands or contracts with temperature change. In many known prior art packages, a lens may be utilized that is made of a hard plastic, such as epoxy, or that is rigidly bonded to the package body, in which case the encapsulant may move in and out of the cavity during temperature change events.

As discussed above, a set of electrical connector electrodes, electrically isolated from the heat sink/mounting block substrate, may be utilized in some embodiments to connect the light emitting device of the package to an external electrical circuit, such as to provide power. In particular embodiments of the present invention, an SMT lead configuration, such as J-bend, gull-wing, or even through-hole leads may be utilized. Such leads may be placed relatively close to the light emitting device(s), which may allow for a potentially more efficient, smaller optical cavity design.

Figure 15:
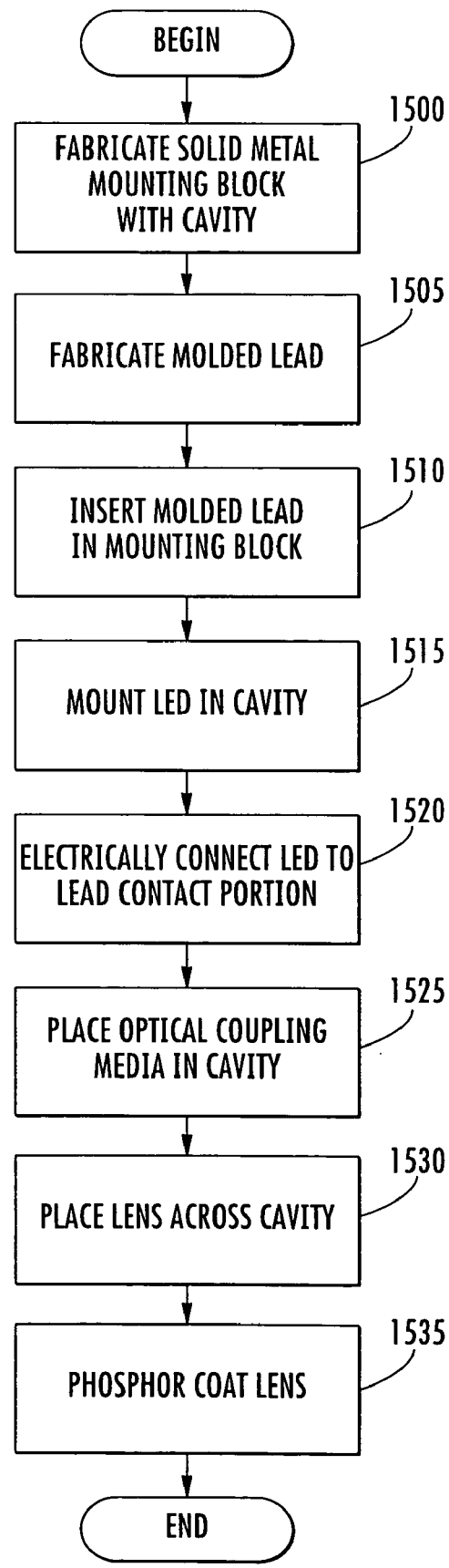
FIG. 15 is flow chart illustrating operations for packaging a semiconductor light emitting device according to some embodiments of the present invention.

Semiconductor light emitting device packaging methods according to some embodiments of the present invention will now be described with reference to the flow chart illustration of FIG. 15. As shown in FIG. 15, operations begin at block 1500 with fabricating of a solid metal block. The solid metal block includes first and second opposing metal faces. The first metal face includes therein a cavity that is configured to mount a semiconductor light emitting device and to reflect light that is emitted by the semiconductor light emitting device mounted therein away from the cavity. A molded lead having a non-conductive molded body portion and a conductive lead extending therethrough is fabricated (Block 1505). The molded lead is inserted in the mounting block and extending into the cavity (Block 1510). The molded lead is isolated from the mounting block by the non-conductive body portion and has an exposed contact portion (pad) in the cavity. The semiconductor light emitting device, such as an LED, is mounted in the cavity (Block 1515). The semiconductor light emitting device is electrically connected to the exposed contact portion (Block 1520).

As also illustrated in FIG. 15, in some embodiments of the present invention, an optical coupling media (such as an encapsulant) is placed in the cavity and at least partially surrounding the semiconductor light emitting device (Block 1525). In further embodiments of the present invention, a lens is placed across the cavity (Block 1530). The lens may be coated with a phosphor (Block 1535). It will be understood that some embodiments of the present invention do not include a phosphor while others include a phosphor or other light converting material that is not coated on the lens. In addition, it will be understood that, for embodiments with a phosphor coated lens, the phosphor coating may be applied before the lens is placed across the cavity at Block 1530.

It will be noted that in some alternate implementations, the functions/acts noted in the blocks of FIG. 15 may occur out of the order noted in the flowchart. For example, two blocks shown in succession may, in fact, be executed substantially concurrently, or the blocks may sometimes be executed in the reverse order, depending upon the functionality/acts involved.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A mounting substrate for a semiconductor light emitting device comprising:
   a thermally conductive mounting block having in a first face thereof a cavity that is configured to mount a semiconductor light emitting device therein and to reflect light that is emitted by the semiconductor light emitting device that is mounted therein away from the cavity; and
   an electrically conductive lead inserted in the mounting block and extending into the cavity, the conductive lead being electrically isolated from the mounting block and having an exposed contact portion in the cavity, wherein the mounting block includes a channel and/or passageway extending inwardly to the cavity from a side face of the mounting block and wherein the conductive lead is mounted in the channel and/or passageway;
   wherein:
   the mounting block includes a second face opposing the first face and a side face extending between the first and second faces; and
   the channel and/or passageway extends through the side face and inwardly through the mounting block to the cavity.

2. The mounting substrate of claim 1 wherein the conductive lead comprises a plurality of conductive leads each having an exposed contact portion at different locations in the cavity.

3. The mounting substrate of claim 2 further comprising cutouts in a sidewall of the cavity proximate respective ones of the contact portions that provide access to the contact portions from the cavity.

4. The mounting substrate of claim 3 wherein the sidewall of the cavity comprises a sloped sidewall.

5. The mounting substrate of claim 2 wherein the plurality of conductive leads comprises a molded lead frame having a non-conductive mold portion that electrically isolates the conductive leads from the mounting block.

6. The mounting substrate of claim 5 wherein the molded lead frame is positioned in the passageways with each of the conductive leads extending through a respective one of the passageways.

7. The mounting substrate of claim 6 wherein the mounting block further comprises a cutaway portion in the second face configured to receive the J-bend lead.

8. The mounting substrate of claim 5 wherein the mold portion further comprises a key portion that mates with a socket in the mounting block to position the molded lead in the mounting block.

9. The mounting substrate of claim 8 wherein the mounting block includes channels in the second face and extending inwardly to the cavity from the side face of the mounting block and wherein the molded lead frame is positioned in the channels with each of the conductive leads extending through a respective one of the channels.

10. The mounting substrate of claim 1 further comprising a reflective coating in the cavity.

11. The mounting substrate of claim 1 in combination with a semiconductor light emitting device that is mounted in the cavity.

12. The mounting substrate of claim 11 wherein the semiconductor light emitting device comprises a plurality of semiconductor light emitting devices.

13. The mounting substrate of claim 11 in further combination with a lens that extends across the cavity.

14. The mounting substrate of claim 13 further comprising an encapsulant in the cavity that optically couples the at least one semiconductor light emitting diode to the lens.

15. The mounting substrate of claim 14 wherein the lens is flexibly fitted to the mounting block to flex with expansion and contraction of the encapsulant.

16. The mounting substrate of claim 14 wherein the lens is at least one of latched or adhesively attached to the mounting block.

17. The mounting substrate of claim 13 in further combination with a coating comprising phosphor on the lens.

18. The mounting substrate of claim 13 wherein the lens includes phosphor dispersed therein.

19. The mounting substrate of claim 11 in further combination with a coating comprising phosphor on the semiconductor light emitting device.

20. The mounting substrate of claim 11 wherein the semiconductor light emitting device comprises a semiconductor light emitting diode.

21. The mounting substrate of claim 11 in combination with an optical coupling media in the cavity at least partially surrounding the semiconductor light emitting device.

22. The mounting substrate of claim 11 in combination with a wire electrically connecting the semiconductor light emitting device to the contact portion.

23. The mounting substrate of claim 22 wherein the wire connects an anode of the semiconductor light emitting device to the contact portion and wherein the mounting substrate further comprises a second electrically conductive lead extending through the mounting block into the cavity that is electrically isolated from the mounting block and has an exposed contact portion in the cavity and wherein the substrate is further in combination with a second wire electrically connecting a cathode of the semiconductor light emitting device to the contact portion of the second conductive lead.

24. The mounting substrate of claim 1 wherein the conductive lead comprises a molded lead having a non-conductive mold portion that electrically isolates the conductive lead from the mounting block.

25. The mounting substrate of claim 24 wherein the mold portion is positioned in the channel and/or passageway.

26. The mounting substrate of claim 24 wherein the mold portion further comprises a key portion that mates with a socket in the mounting block to position the molded lead in the mounting block.

27. The mounting substrate of claim 24 wherein the mold portion further comprises an access passage extending from the conductive lead to a face of the mold portion and that allows access for a tool to the lead during molding of the mold portion.

28. The mounting substrate of claim 27 wherein the access passage comprises a plurality of access passages at displaced locations.

29. The mounting substrate of claim 24 wherein the conductive lead includes a J-bend surface mount technology (SMT) lead on an end thereof extending from the mounting block, and the mold portion further comprises a cutaway portion in a face thereof configured to receive the J-bend lead.

30. The mounting substrate of claim 1 wherein the conductive lead includes a surface mount technology (SMT) lead on an end thereof extending from the mounting block.

31. The mounting substrate of claim 30 wherein the SMT lead comprises a J-bend or a gullwing lead.

32. The mounting substrate of claim 1, wherein the conductive lead is removably mounted in the channel and/or passageway.

33. The mounting substrate of claim 1 wherein the mounting block is a one-piece structural member.

34. The mounting substrate of claim 33 wherein the mounting block is a solid metal block.

35. The mounting substrate of claim 34 wherein the metal block comprises a solid steel block, a solid aluminum block or a solid copper block.

36. A mounting substrate for a semiconductor light emitting device comprising:
 a thermally conductive mounting block having first and second opposing faces and a side face therebetween, the first face including thereon a mounting surface that is configured to receive a semiconductor light emitting device thereon;
 an electrically conductive lead extending inwardly from the side face of the mounting block inserted into the mounting block, the conductive lead being electrically isolated from the mounting block and having an exposed contact portion on a surface thereof facing the first face of the mounting block proximate the mounting surface, wherein the mounting block includes a channel and/or passageway extending inwardly to a region proximate the mounting surface from the side face of the mounting block and wherein the conductive lead is mounted in the channel and/or passageway;
 wherein the channel and/or passageway extends through the side face and inwardly through the mounting block to the region proximate the mounting surface.

37. The mounting substrate of claim 36, wherein the conductive lead extends longitudinally inwardly from the side face of the mounting block a distance exceeding a height of the conductive lead.

38. The mounting substrate of claim 36, wherein the conductive lead is removably mounted in the channel and/or passageway.

39. The mounting substrate of claim 36 wherein the mounting block is a one-piece structural member.

* * * * *